United States Patent
Furlong et al.

(10) Patent No.: US 9,103,696 B2
(45) Date of Patent: Aug. 11, 2015

(54) EXTENDED RANGE POSITION SENSOR SYSTEM

(75) Inventors: Gregory Furlong, Freeport, IL (US); John Benton, Shady Grove, PA (US)

(73) Assignees: HONEYWELL INTERNATIONAL INC., Morristown, NJ (US); GROVE US LLC, Shady Grove, PA (US)

( * ) Notice: Subject to any disclaimer, the term of this patent is extended or adjusted under 35 U.S.C. 154(b) by 316 days.

(21) Appl. No.: 13/572,205

(22) Filed: Aug. 10, 2012

(65) Prior Publication Data
US 2013/0214766 A1 Aug. 22, 2013

Related U.S. Application Data

(60) Provisional application No. 61/523,724, filed on Aug. 15, 2011.

(51) Int. Cl.
| | |
|---|---|
| *G01B 7/30* | (2006.01) |
| *G01D 5/16* | (2006.01) |
| *H04N 1/00* | (2006.01) |
| *G02B 1/00* | (2006.01) |
| *G06F 1/00* | (2006.01) |
| *G01R 33/09* | (2006.01) |
| *G01D 5/12* | (2006.01) |
| *G01D 5/14* | (2006.01) |

(52) U.S. Cl.
CPC .. *G01D 5/16* (2013.01); *G01D 5/12* (2013.01); *G01D 5/145* (2013.01); *G01R 33/093* (2013.01); *G02B 1/00* (2013.01); *G06F 1/00* (2013.01); *H04N 1/00* (2013.01)

(58) Field of Classification Search
CPC . H04N 1/00; H04N 2101/00; H04N 2201/00; H04N 2213/00; G06F 1/00; G06F 2101/00; G06F 2200/00; G06F 2201/00; G02B 1/00; G02B 2207/00

USPC ............ 324/207.21, 207.11, 207.12, 207.13, 324/207.14, 207.18, 207.2, 207.22, 207.23, 324/207.24, 207.25, 242, 243, 259, 260
See application file for complete search history.

(56) References Cited

U.S. PATENT DOCUMENTS

| | | | |
|---|---|---|---|
| 5,221,250 A | * | 6/1993 | Cheng .............................. 494/7 |
| 5,412,317 A | | 5/1995 | Kyoizumi |
| 6,297,628 B1 | | 10/2001 | Bicking et al. |

(Continued)

OTHER PUBLICATIONS

PCT International Search Report and the Written Opinion of the International Searching Authority dated Feb. 25, 2013 for application No. PCT/US2012/050571.

*Primary Examiner* — Huy Q Phan
*Assistant Examiner* — Temilade S Rhodes-Vivour
(74) *Attorney, Agent, or Firm* — Ingrassia Fisher & Lorenz, P.C.

(57) ABSTRACT

An extended range position sensor system includes a first set of spaced-apart magnets, a first sensor, a second set of spaced-apart magnets, a second sensor, and a processor. The first sensor is associated with and is movable relative to the first set of magnets, and is configured to generate a first sensor output signal in response to relative movement between the first sensor and the first set of magnets. The second sensor is associated with and is movable relative to the second set of magnets, and is configured to generate a second sensor output signal in response to relative movement between the second sensor and the second set of magnets. The processor is coupled to receive the first and second sensor output signals and is configured, in response thereto, to generate a position signal.

20 Claims, 5 Drawing Sheets

(56) References Cited

U.S. PATENT DOCUMENTS

| | | |
|---|---|---|
| 6,400,138 B1 | 6/2002 | Andermo |
| 6,960,974 B2 | 11/2005 | Wan et al. |
| 7,408,343 B2 | 8/2008 | Dmytriw et al. |
| 2005/0225321 A1* | 10/2005 | Kurumado ............... 324/207.21 |
| 2007/0096723 A1* | 5/2007 | Rieger et al. ............. 324/207.24 |
| 2007/0132447 A1* | 6/2007 | Reimer et al. ........... 324/207.21 |
| 2010/0271011 A1* | 10/2010 | Shimizu ................... 324/207.13 |
| 2011/0148398 A1* | 6/2011 | Yang et al. ............... 324/207.11 |

* cited by examiner

EXTENDED RANGE POSITION SENSOR SYSTEM

CROSS-REFERENCE TO RELATED APPLICATION

This application claims the benefit of U.S. Provisional Application No. 61/523,724, filed Aug. 15, 2011.

TECHNICAL FIELD

The present invention generally relates to position sensors, and more particularly relates to a system for extending the position detection range of a position sensor.

BACKGROUND

Various types of position sensors are known in the art. One type of position sensor employs an array of magnetoresistive (MR) sensors to sense the position of a magnet, which may be attached to a moving object, relative to the MR sensors. Presently, this type of position sensor is configured to sense linear positions of up to a maximum of 225 millimeters (mm) However, some applications, such as fork lift position, or outrigger position on a crane, may need position sensing in ranges much larger than this. For example, from 0.5 to 4 meters.

Accordingly, it is desirable to provide a manner to extend the position detection range of a known, relatively accurate and reliable sensor.

BRIEF SUMMARY

In one embodiment, a position sensor system includes a first set of magnets, a first sensor, a second set of magnets, a second sensor, and a processor. Each magnet in the first set of magnets is spaced apart from at least one other magnet in the first set of magnets by a first linear distance. The first sensor is associated with and is movable relative to the first set of magnets. The first sensor is configured to generate a first sensor output signal in response to relative movement between the first sensor and the first set of magnets. Each magnet in the second set of magnets is spaced apart from at least one other magnet in the second set of magnets by a second linear distance that is unequal to the first linear distance. The second sensor is associated with and is movable relative to the second set of magnets. The second sensor is configured to generate a second sensor output signal in response to relative movement between the second sensor and the second set of magnets. The processor is coupled to receive the first and second sensor output signals and is configured, in response thereto, to generate a position signal.

In another embodiment, a position sensor system includes a first set of magnets, first sensor, a second set of magnets, a second sensor, and a processor. Each magnet in the first set of magnets is spaced apart from at least one other magnet in the first set of magnets by a first linear distance. The first sensor is associated with and is movable relative to the first set of magnets. The first sensor is configured to generate a first sensor output signal in response to relative movement between the first sensor and the first set of magnets. Each magnet in the second set of magnets is spaced apart from at least one other magnet in the second set of magnets by a second linear distance that is greater than the first linear distance. The second sensor is associated with and is movable relative to the second set of magnets. The second sensor is configured to generate a second sensor output signal in response to relative movement between the second sensor and the second set of magnets. The processor is coupled to receive the first and second sensor output signals and is configured, in response thereto, to determine a difference between the first and second sensor output signals and generate a position signal based on the first sensor output signal and the difference between the first and second sensor output signals.

In yet another embodiment, a position sensor system includes a first set of magnets, a second set of magnets, a first sensor, a second sensor, a third sensor, a fourth sensor, and a processor. Each magnet in the first set of magnets is spaced apart from at least one other magnet in the first set of magnets by a first linear distance. Each magnet in the second set of magnets is spaced apart from at least one other magnet in the second set of magnets by a second linear distance that is unequal to the first linear distance. The first sensor is associated with and is movable relative to the first set of magnets. The first sensor is configured to generate a first sensor output signal in response to relative movement between the first sensor and the first set of magnets. The second sensor is associated with and is movable relative to the second set of magnets. The second sensor is configured to generate a second sensor output signal in response to relative movement between the second sensor and the second set of magnets. The third sensor is coupled to the first sensor, and is associated with and is movable relative to the first set of magnets. The third sensor is configured to generate a third sensor output signal in response to relative movement between the third sensor and the first set of magnets. The fourth sensor is coupled to the second sensor, and is associated with and movable relative to the second set of magnets. The fourth sensor is configured to generate a fourth sensor output signal in response to relative movement between the fourth sensor and the second set of magnets. The processor is coupled to receive the first, second, third, and fourth sensor output signals and is configured, in response thereto, to combine the first and third sensor output signals to generate a first combined signal, combine the second and fourth output signals to generate a second combined signal, determine a difference between the first and second combined signals, and generate the position signal based on the difference between the first and second combined signals.

Furthermore, other desirable features and characteristics of the extended range position sensor system will become apparent from the subsequent detailed description and the appended claims, taken in conjunction with the accompanying drawings and the preceding background.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

This invention is a unique method of using a plurality of linear magnetic position sensors in conjunction with a series of magnets to create a distinct output. The magnets are spaced in a manner that the plurality of position sensors provides an output is unique to the relative position of the magnets and sensors, and provides an absolute position sensor over a range of up to 4 meters.

Figure 1:
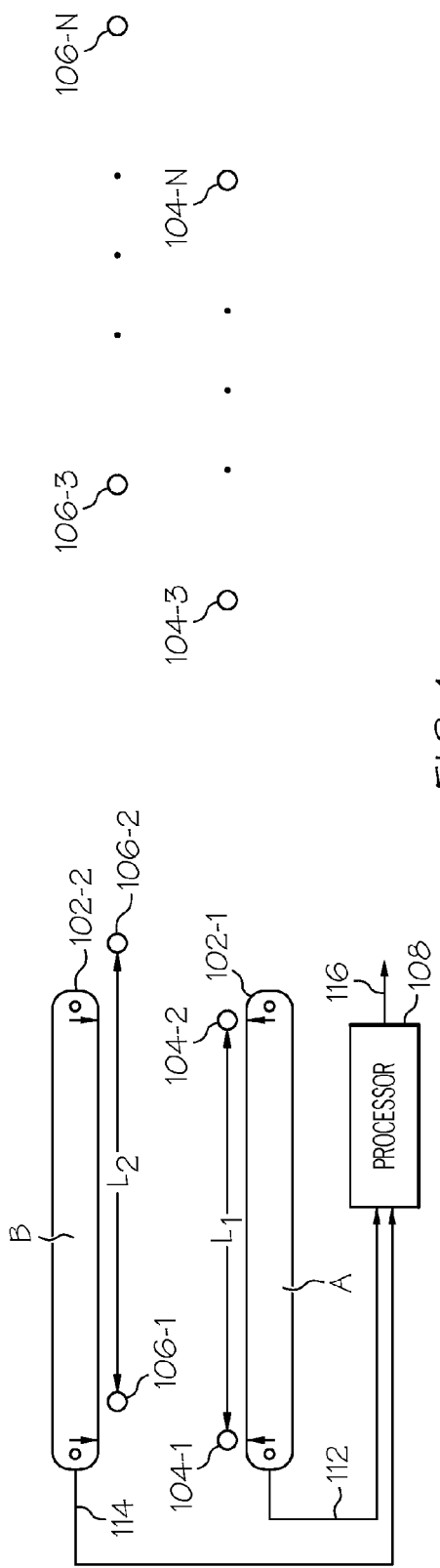
FIG. 1 is a functional block diagram of an extended range position sensing system.

In one embodiment, which is depicted in FIG. 1, an extended range position sensing system 100 includes two sensors 102, a first sensor 102-1 and a second sensor 102-2, two sets of magnets, a first set of magnets 104 (e.g., 104-1, 104-2, 104-3 . . . 104-N) and a second set of magnets 106 (e.g., 106-1, 106-2, 106-3 . . . 106-N), and a processor 108. The first and second sensors 102-1, 102-2 are identically configured to sense a preset linear distance. This linear distance may vary, but in one particular embodiment the sensors 102 are configured to sense a linear distance of 225 millimeters (mm)

Figure 2:
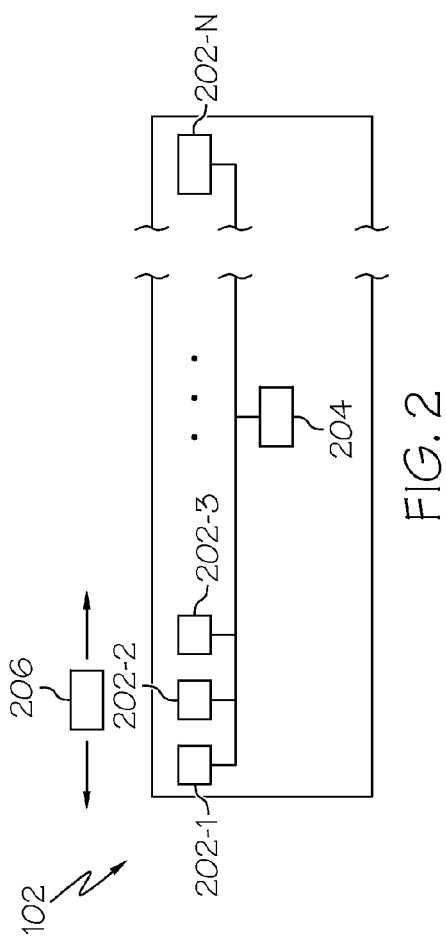
FIG. 2 depicts a functional block diagram of one sensor that may be used to implement the sensor system of FIG. 1.

Although the sensors 102 may be variously implemented, in one particular embodiment, which is depicted in FIG. 2, each sensor 102 includes a plurality of MR sensors 202 (e.g., 202-1, 202-2, 202-3 . . ., 202-N), and one or more processors 204 (only one depicted). Thus, as FIG. 2 also depicts, as the position of a magnet 206 varies relative to each of the MR sensors 202, the output of each MR sensor 202 varies. The outputs of each MR sensor 202 are supplied to the processor 204, which determines the linear position of the magnet 206 relative to the sensor 102. It will be appreciated that the MR sensors 202 may be variously implemented. In one embodiment, each is implemented using a MR bridge.

Returning to FIG. 1, the first set of magnets 104 is associated with the first sensor 102-1, and the second set of magnets 106 is associated with the second sensor 102-2. The first and second sets of magnets 104, 106 are preferably implemented using identical, or substantially identical, magnets. While the spacing between each magnet (e.g., 104-1, 104-2, 104-3 . . ., 104-N) in the first set 104 is identical, and the spacing between each magnet (e.g., 106-1, 106-2, 106-3 . . . , 106-N) in the first set 106 is identical, the spacing between each magnet in the first set 104 differs from that of the second set 106. For example, the magnets in the first set of magnets 104 are spaced apart by a first linear distance ($L_1$), whereas the magnets in the second set of magnets 106 are spaced apart by a second linear distance ($L_2$) that is greater than the first linear distance. The specific linear distances ($L_1$, $L_2$) may vary, but in one embodiment, in which the sensors 102 are implemented using 225 millimeter (mm) linear sensors, the magnets in the first set of magnets 104 are spaced at 225 mm, whereas the magnets in the second set of magnets 106 are spaced at 235 mm with an initial offset of 10 mm.

No matter the specific linear distances between each of the magnets, as the first sensor 102-1 and the first set of magnets 104 are moved relative to each other, the first sensor 102-1 generates a first sensor output signal 112. Similarly, as the second sensor 102-2 and the second set of magnets 106 are moved relative to each other, the second sensor 102-2 generates a second sensor output signal 114. The first and second sensor output signals 112, 114 are supplied to the processor 108.

The processor 108 is coupled to receive the first and second sensor output signals 112, 114 and is configured, upon receipt thereof, to generate a position signal 116. The processor 108 may be variously configured to generate the position signal 116. In one particular embodiment, however, the processor is configured to compare the output signals (112, 114) of each of the sensors 102-1, 102-2 and, based on this comparison, generate the position signal 116. This concept is best illustrated by reference to FIG. 3, which depicts the first and second sensor output signals 112, 114 together with the position signal 116. As shown, the first sensor output signal 112 is a linear signal that repeats each time the first sensor 102-1 travels the first linear distance (L1). The second sensor output signal 114 is also a linear signal that repeats, but each time the second sensor 102-2 travels the second linear distance (L2). Because the second linear distance (L2) is greater than the first linear distance (L1), the difference between first and second sensor output signals 112, 114 will vary as the first and second sensors 102 move. It is this difference that processor 108 uses, together with the first sensor output signal 112, to generate the position signal 116. For example, as FIG. 3 further depicts, the first sensor output signal 112 is identical at the distances labeled d1, d2, and d3; however, the second sensor output signal 114 is not. Moreover, the difference between the first and second output signals 112, 114 at each of these distances is also unequal. Thus, the position signal 116 is generated based on the first sensor output signal 112, and the difference between the first and second sensor output signals 112, 114.

Figure 3:
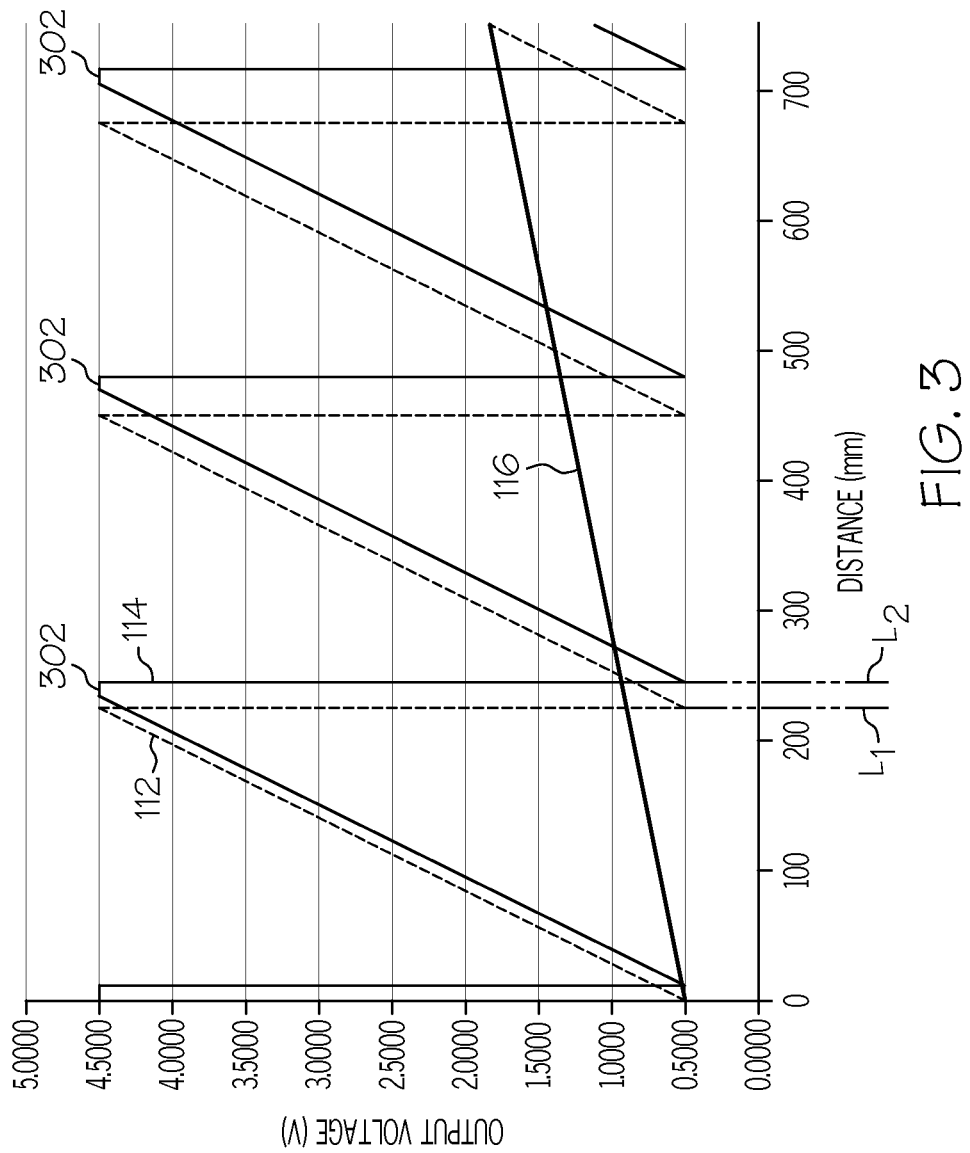
FIG. 3 depicts various output signals associated with the sensor system of FIG. 1.
Figure 4:
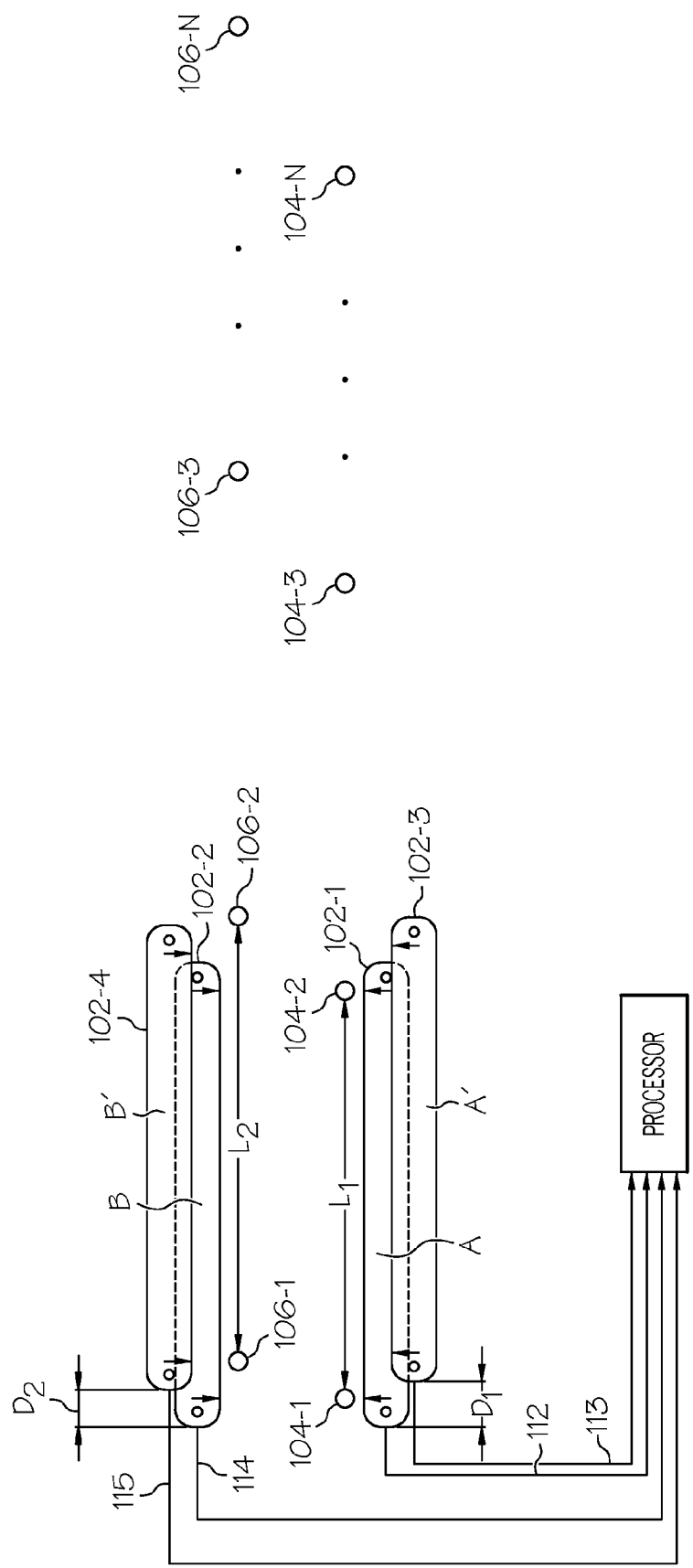
FIG. 4 is a functional block diagram of another embodiment of an extended range position sensing system.

It may be noted that the second sensor output signal 114 depicted in FIG. 3 includes a flat peak portion 302 near each incremental distance of $L_2$. This can, in some instances, create dead-spots and/or hysteresis. To alleviate this potential problem, two additional sensors—a third sensor 102-3 and a fourth sensor 102-4—may be added to the system 100. As depicted in FIG. 4, the first sensor 102-1 and the third sensor 102-3 are coupled together, and the second sensor 102-2 and the fourth sensor 102-4 are coupled together. The third sensor 102-3 is offset from the first sensor 102-1 by a first predetermined offset distance ($D_1$) and the fourth sensor 102-4 is offset from the second sensor 102-2 by a second predetermined offset distance ($D_2$). The first and second predetermined offset distances may be equal or unequal. In one embodiment, the first predetermined distance is about 25 mm and the second predetermined distance is about 20 mm.

Figure 5:
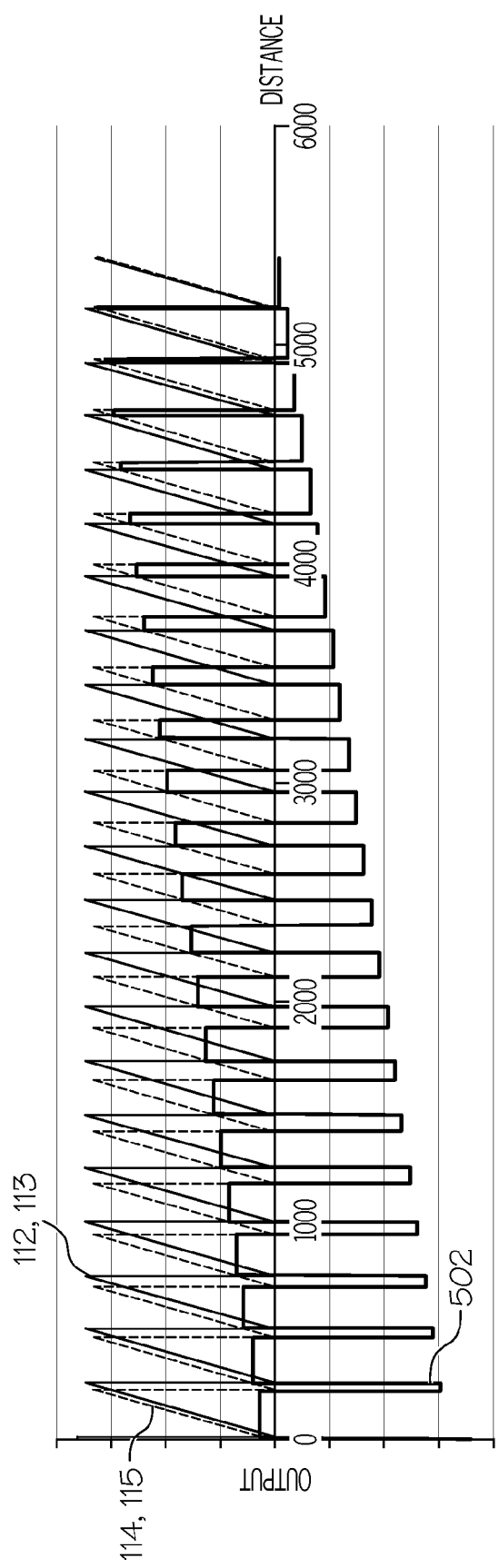
FIG. 5 depicts various signals associated with the system of FIG. 4.
Figure 6:
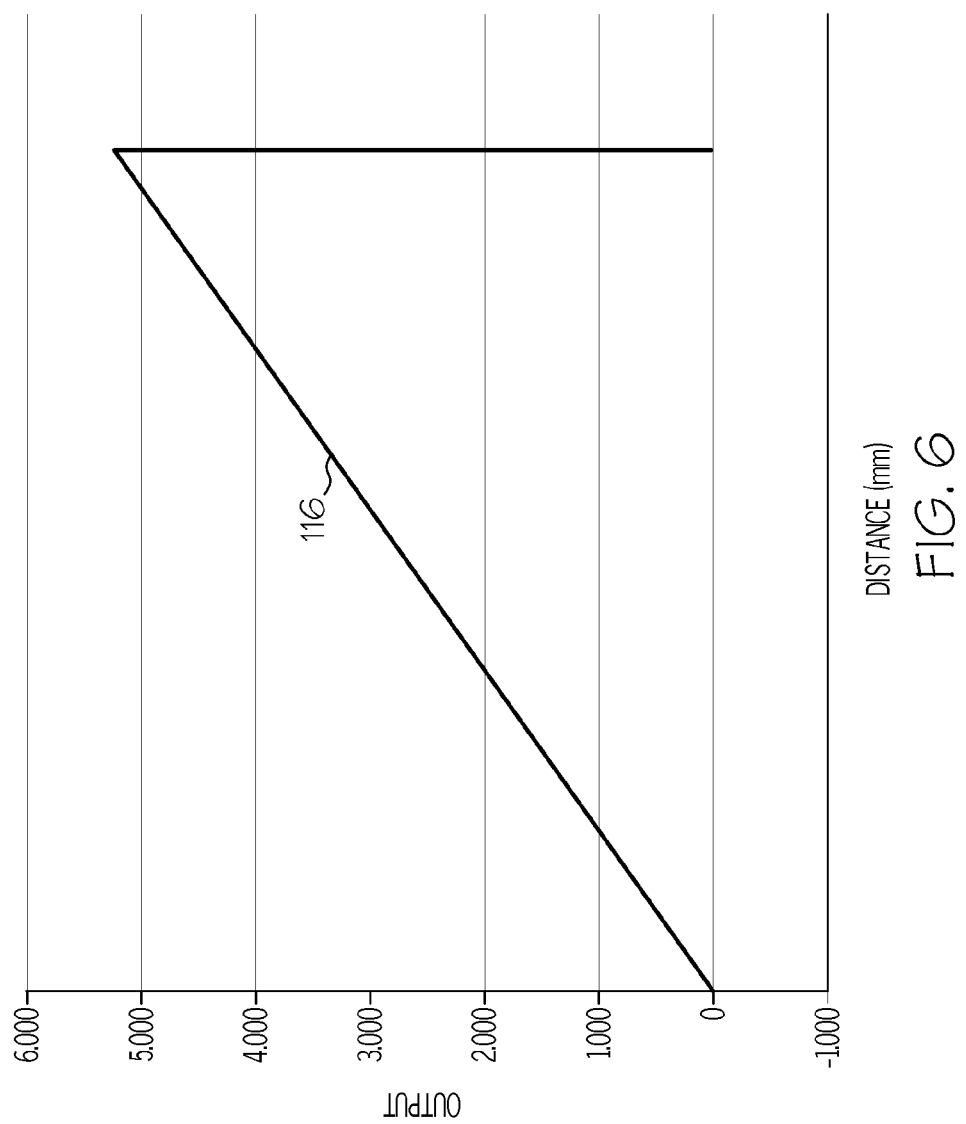
FIG. 6 depicts an exemplary output signal of the system of FIG. 4.

In the embodiment depicted in FIG. 4, the processor 108 is coupled to receive not only the first and second sensor output signals 112, 114, but also a third sensor output signal 113 from the third sensor 102-3 and a fourth sensor output signal 115 from the fourth sensor 102-4. The processor 108 is configured, upon receipt of these signals, to generate a position signal 116. The processor 108 may be variously configured to generate the position signal 116. In one particular embodiment, however, the processor is configured to combine the first and third output signals 112, 113, combine the second and fourth output signals 114, 115, and determine the difference between these combined signals. Then, based on the determined difference, the processor 108 generates the position signal 116. This concept is best illustrated by reference to FIGS. 5 and 6. FIG. 5 depicts the combined first and third sensor output signals 112, 113, the combined second and fourth output signals 114, 115, together with the determined difference, and FIG. 6 depicts the output signal 116.

The processor 108 may implement various algorithms to achieve the functionality described above, and the sensors 102 may be variously configured and implemented. In one particular embodiment, all of the sensors 102 are configured as 225 mm sensors, the first and third sensors 102-1, 102-2 overlap by about 25 mm, and the second and fourth sensors 102-2, 102-4 overlap by about 20 mm.

Those of skill in the art will appreciate that the various illustrative logical blocks, modules, circuits, and algorithm steps described in connection with the embodiments disclosed herein may be implemented as electronic hardware, computer software, or combinations of both. Some of the embodiments and implementations are described above in terms of functional and/or logical block components (or modules) and various processing steps. However, it should be appreciated that such block components (or modules) may be realized by any number of hardware, software, and/or firmware components configured to perform the specified functions. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. The word "exemplary" is used exclusively herein to mean "serving as an example, instance, or illustration." Any embodiment described herein as "exemplary" is not necessarily to be construed as preferred or advantageous over other embodiments.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal In the alternative, the processor and the storage medium may reside as discrete components in a user terminal In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention.

What is claimed is:

1. A position sensor system, comprising:
    a first set of magnets, each magnet in the first set of magnets spaced apart from at least one other magnet in the first set of magnets by a first linear distance;
    a first sensor associated with and movable relative to the first set of magnets, the first sensor configured to sense a preset linear distance and generate a first sensor linear output signal in response to relative linear movement between the first sensor and the first set of magnets, wherein the first sensor linear output signal repeats each time the first sensor travels the first linear distance;
    a second set of magnets, each magnet in the second set of magnets spaced apart from at least one other magnet in the second set of magnets by a second linear distance, the second linear distance unequal to the first linear distance;
    a second sensor associated with and movable relative to the second set of magnets, the second sensor configured to sense the preset linear distance and generate a second sensor linear output signal in response to relative linear movement between the second sensor and the second set of magnets, wherein the second sensor linear output signal repeats each time the second sensor travels the second linear distance; and
    a processor coupled to receive the first and second sensor linear output signals and configured, in response thereto, to generate a position signal.

2. The system of claim 1, wherein the processor is configured to:
determine a difference between the first and second sensor linear output signals; and
generate the position signal based on the first sensor linear output signal and the difference between the first and second sensor linear output signals.

3. The system of claim 1, wherein the second linear distance is greater than the first linear distance.

4. The system of claim 1, wherein the first and second sensor each comprise:
a plurality of magnetoresistive (MR) sensors, each MR sensor configured to supply an MR sensor output that varies relative thereto; and
one or more sensor processors coupled to receive the MR sensor outputs.

5. The system of claim 1, wherein:
each magnet of the magnets in the first set of magnets are identical; and
each of the magnets in the second set of magnets are identical.

6. The system of claim 1, further comprising:
a third sensor coupled to the first sensor, the third sensor associated with and movable relative to the first set of magnets, the third sensor configured to sense the preset linear distance and generate a third sensor linear output signal in response to relative linear movement between the third sensor and the first set of magnets;
a fourth sensor coupled to the second sensor, the fourth sensor associated with and movable relative to the second set of magnets, the fourth sensor configured to sense the preset linear distance and generate a fourth sensor linear output signal in response to relative linear movement between the fourth sensor and the second set of magnets.

7. The system of claim 6, wherein:
the third sensor is offset from the first sensor by a first predetermined distance; and
the fourth sensor is offset from the second sensor by a second predetermined distance.

8. The system of claim 7, wherein the first and second predetermined distances are equal.

9. The system of claim 6, wherein the processor is further coupled to receive the third and fourth sensor linear output signals and is further configured, in response thereto, to generate the position signal.

10. The system of claim 9, wherein the processor is further configured to:
combine the first and third sensor linear output signals to generate a first combined signal;
combine the second and fourth sensor linear output signals to generate a second combined signal;
determine a difference between the first and second combined signals; and
generate the position signal based on the difference between the first and second combined signals.

11. A position sensor system, comprising:
a first set of magnets, each magnet in the first set of magnets spaced apart from at least one other magnet in the first set of magnets by a first linear distance;
a first sensor associated with and movable relative to the first set of magnets, the first sensor configured to generate a first sensor output signal in response to relative movement between the first sensor and the first set of magnets;
a second set of magnets, each magnet in the second set of magnets spaced apart from at least one other magnet in the second set of magnets by a second linear distance, the second linear distance greater than the first linear distance;
a second sensor associated with and movable relative to the second set of magnets, the second sensor configured to generate a second sensor output signal in response to relative movement between the second sensor and the second set of magnets; and
a processor coupled to receive the first and second sensor output signals and configured, in response thereto, to:
determine a difference between the first and second sensor output signals; and
generate a position signal based on the first sensor output signal and the difference between the first and second sensor output signals.

12. The system of claim 11, wherein:
each magnet of the magnets in the first set of magnets are identical; and
each of the magnets in the second set of magnets are identical.

13. The system of claim 11, further comprising:
a third sensor coupled to the first sensor, the third sensor associated with and movable relative to the first set of magnets, the third sensor configured to generate a third sensor output signal in response to relative movement between the third sensor and the first set of magnets;
a fourth sensor coupled to the second sensor, the fourth sensor associated with and movable relative to the second set of magnets, the fourth sensor configured to generate a fourth sensor output signal in response to relative movement between the fourth sensor and the second set of magnets.

14. The system of claim 13, wherein:
the third sensor is offset from the first sensor by a first predetermined distance; and
the fourth sensor is offset from the second sensor by a second predetermined distance.

15. The system of claim 14, wherein the first and second predetermined distances are equal.

16. The system of claim 13, wherein the processor is further coupled to receive the third and fourth sensor output signals and is further configured, in response thereto, to:
combine the first and third sensor output signals to generate a first combined signal;
combine the second and fourth output signals to generate a second combined signal;
determine a difference between the first and second combined signals; and
generate the position signal based on the difference between the first and second combined signals.

17. The system of claim 13, wherein the first, second, third, and fourth sensors each comprise:
a plurality of magnetoresistive (MR) sensors, each MR sensor configured to supply an MR sensor output that varies relative thereto; and
one or more sensor processors coupled to receive the MR sensor outputs.

18. A position sensor system, comprising:
a first set of magnets, each magnet in the first set of magnets spaced apart from at least one other magnet in the first set of magnets by a first linear distance;
a second set of magnets, each magnet in the second set of magnets spaced apart from at least one other magnet in the second set of magnets by a second linear distance, the second linear distance unequal to the first linear distance;

a first sensor associated with and movable relative to the first set of magnets, the first sensor configured to generate a first sensor output signal in response to relative movement between the first sensor and the first set of magnets;

a second sensor associated with and movable relative to the second set of magnets, the second sensor configured to generate a second sensor output signal in response to relative movement between the second sensor and the second set of magnets;

a third sensor coupled to the first sensor, the third sensor associated with and movable relative to the first set of magnets, the third sensor configured to generate a third sensor output signal in response to relative movement between the third sensor and the first set of magnets;

a fourth sensor coupled to the second sensor, the fourth sensor associated with and movable relative to the second set of magnets, the fourth sensor configured to generate a fourth sensor output signal in response to relative movement between the fourth sensor and the second set of magnets; and a processor coupled to receive the first, second, third, and fourth sensor output signals and configured, in response thereto, to:
  combine the first and third sensor output signals to generate a first combined signal;
  combine the second and fourth output signals to generate a second combined signal;
  determine a difference between the first and second combined signals; and
  generate a position signal based on the first combined signal and the difference between the first and second combined signals.

19. The system of claim 18, wherein:
the third sensor is offset from the first sensor by a first predetermined distance; and
the fourth sensor is offset from the second sensor by a second predetermined distance.

20. The system of claim 18, wherein:
each magnet of the magnets in the first set of magnets are identical;
each of the magnets in the second set of magnets are identical;
the first and second predetermined distances are equal; and
the first, second, third, and fourth sensors each comprise:
  a plurality of magnetoresistive (MR) sensors, each MR sensor configured to supply an MR sensor output that varies relative thereto; and
  one or more sensor processors coupled to receive the MR sensor outputs.

* * * * *